United States Patent
Lee

(10) Patent No.: US 9,210,501 B2
(45) Date of Patent: Dec. 8, 2015

(54) POP-NOISE REMOVING METHOD

(71) Applicant: HYUNDAI MOBIS CO., LTD., Seoul (KR)

(72) Inventor: Yong Joon Lee, Seoul (KR)

(73) Assignee: Hyundai Mobis Co., Ltd., Yongin-si (KR)

( * ) Notice: Subject to any disclaimer, the term of this patent is extended or adjusted under 35 U.S.C. 154(b) by 235 days.

(21) Appl. No.: 13/874,992

(22) Filed: May 1, 2013

(65) Prior Publication Data

US 2013/0294615 A1    Nov. 7, 2013

(30) Foreign Application Priority Data

May 3, 2012    (KR) .......................... 10-2012-0047051

(51) Int. Cl.
| | | |
|---|---|---|
| *A61F 11/06* | (2006.01) | |
| *G10K 11/16* | (2006.01) | |
| *H03B 29/00* | (2006.01) | |
| *H04R 3/00* | (2006.01) | |
| *G10L 19/005* | (2013.01) | |
| *H04L 1/00* | (2006.01) | |
| *H04H 60/11* | (2008.01) | |
| *H03M 13/09* | (2006.01) | |

(52) U.S. Cl.
CPC .............. *H04R 3/002* (2013.01); *G10L 19/005* (2013.01); *H04L 1/0045* (2013.01); *H04L 1/0061* (2013.01); *H03M 13/09* (2013.01); *H04H 60/11* (2013.01)

(58) Field of Classification Search
CPC .................................................. G10K 11/1788
See application file for complete search history.

(56) References Cited

U.S. PATENT DOCUMENTS

2006/0051066 A1 *  3/2006  Aridome et al. .............. 386/111
2008/0024665 A1 *  1/2008  Nakoji .......................... 348/558

FOREIGN PATENT DOCUMENTS

CN       1573929 A       2/2005

* cited by examiner

*Primary Examiner* — Simon King
(74) *Attorney, Agent, or Firm* — NSIP Law

(57) ABSTRACT

Provided is a pop-noise removing method. The pop-noise removing method analyzes an acoustic noise, occurring when receiving digital broadcasting under a weak electric field environment, and reduces a pop-noise on the basis of the analyzed result, for transferring digital broadcasting with a minimized pop-noise to consumers. Accordingly, an output of the pop-noise of digital broadcasting can be minimized.

6 Claims, 3 Drawing Sheets

POP-NOISE REMOVING METHOD

CROSS-REFERENCE TO RELATED APPLICATIONS

This application claims priority under 35 U.S.C. §119 to Korean Patent Application No. 10-2012-0047051, filed on May 3, 2012, the disclosure of which is incorporated herein by reference in its entirety.

TECHNICAL FIELD

The present invention relates to a pop-noise removing method, and more particularly, to a method of removing a pop-noise of an audio signal from a broadcast stream.

BACKGROUND

In the related art, since a mute is turned on/off based on a mute threshold level and a signal quality level (threshold), a pop-noise occurs.

Specifically, in the related art, since the mute is turned on/off by detecting a mute level after a pop occurs, even if the mute level is accurately detected, it is unable to accurately determine an output time of a pop-noise, and thus, occurrence of the pop-noise cannot be prevented.

Digital broadcasting is to digitalize and process a radio signal, including voice, data, video, etc., and then transmit and receive the digitalized radio signal in a digital transmission system.

A radio signal cannot smoothly be received due to radio frequency interference (RH), which is caused by geographical features, nearby buildings, or a distance from broadcasting equipment to a target point, or a radio shadow area (weak electric field noise environment).

Like this, when a radio signal is received with clarity thereof being reduced by interference or shadow, an error can occur in deciding 0 or 1 of the received radio signal (digital signal), causing loss of information.

A noise (error) of the radio signal, especially, a digital audio signal, causes a bit deterioration, an information error, or a scalefactor data error. Here, the bit deterioration causes a sampling rate error, an error in the number of sub-bands, an operation error of an option function, or the like, and the information error causes deviation of bit data, generation of different sound (noise), an error return, or a change, such as an operation stop, in an audio decoder characteristic. Also, due to the scalefactor data error, sound increases or decreases (where the sound is easy to be recognized as a noise in increasing) in a specific sub-band, or energy corresponding to a specific frequency increases or decreases (where the energy is easy to be recognized as a noise in increasing).

Moreover, a bit error can be transferred as an acoustic noise, and thus, an acoustic shock can occur. Sudden loud sound or high frequency sound, such as the acoustic shock, can damage a viewer's hearing or apply metal and physical anguish to the viewer.

SUMMARY

Accordingly, the present invention provides a pop-noise removing method which analyzes an acoustic noise, occurring when receiving digital broadcasting under a weak electric field environment, and reduces a pop-noise on the basis of the analyzed result, for transferring digital broadcasting with a minimized pop-noise to consumers.

In one general aspect, a pop-noise removing method includes: performing, when a audio signal is received, a CRC on audio stream data in units of a frame; and doing, when audio frame data is determined to be broken as the CRC result, a fade-in of an audio volume at an output time of audio frame data just previous to the broken audio frame data, for preventing a pop-noise from occurring when decoding the broken audio frame data.

Other features and aspects will be apparent from the following detailed description, the drawings, and the claims.

DETAILED DESCRIPTION OF EMBODIMENTS

The advantages, features and aspects of the present invention will become apparent from the following description of the embodiments with reference to the accompanying drawings, which is set forth hereinafter. The present invention may, however, be embodied in different forms and should not be construed as limited to the embodiments set forth herein. Rather, these embodiments are provided so that this disclosure will be thorough and complete, and will fully convey the scope of the present invention to those skilled in the art. The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Figure 1:
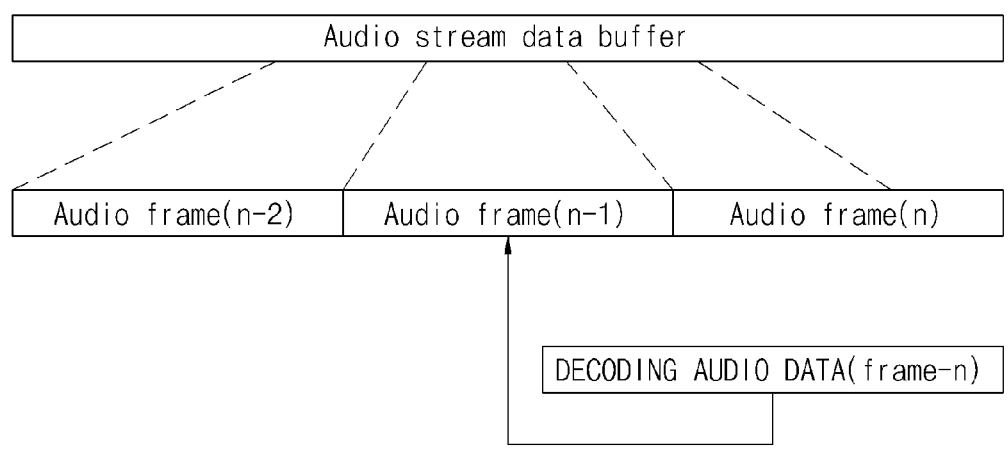
FIG. 1 is a diagram for describing detection of a time when occurrence of a pop-noise is predicted and decision of a time when audio is output.
Figure 2:
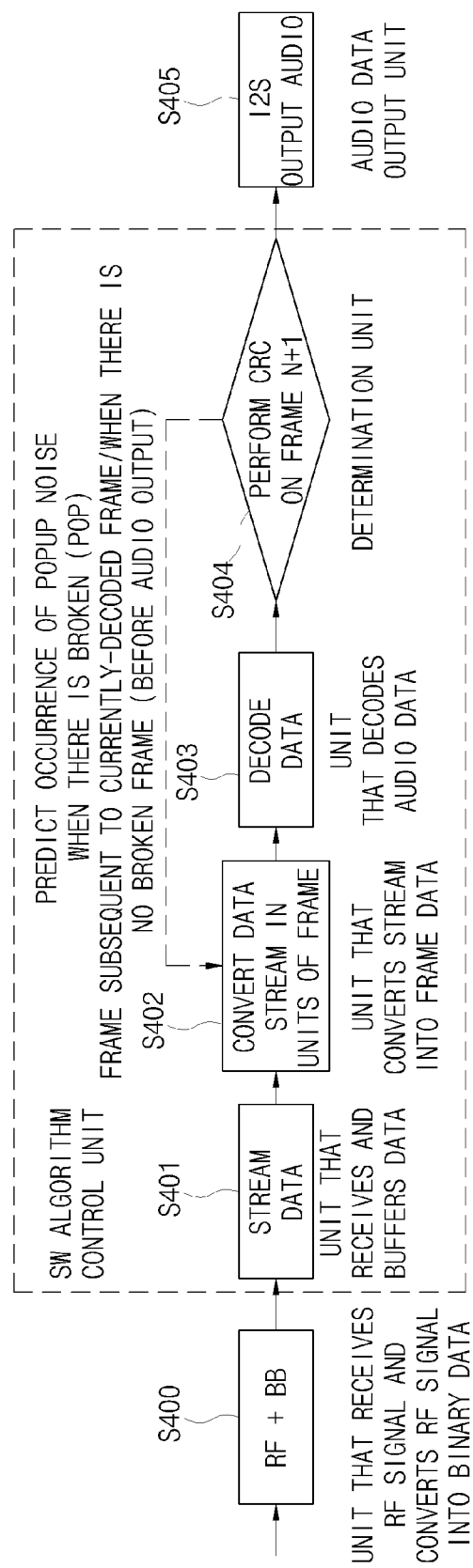
FIGS. 2 and 3 are diagrams for describing FIG. 1 in more detail.
Figure 3:
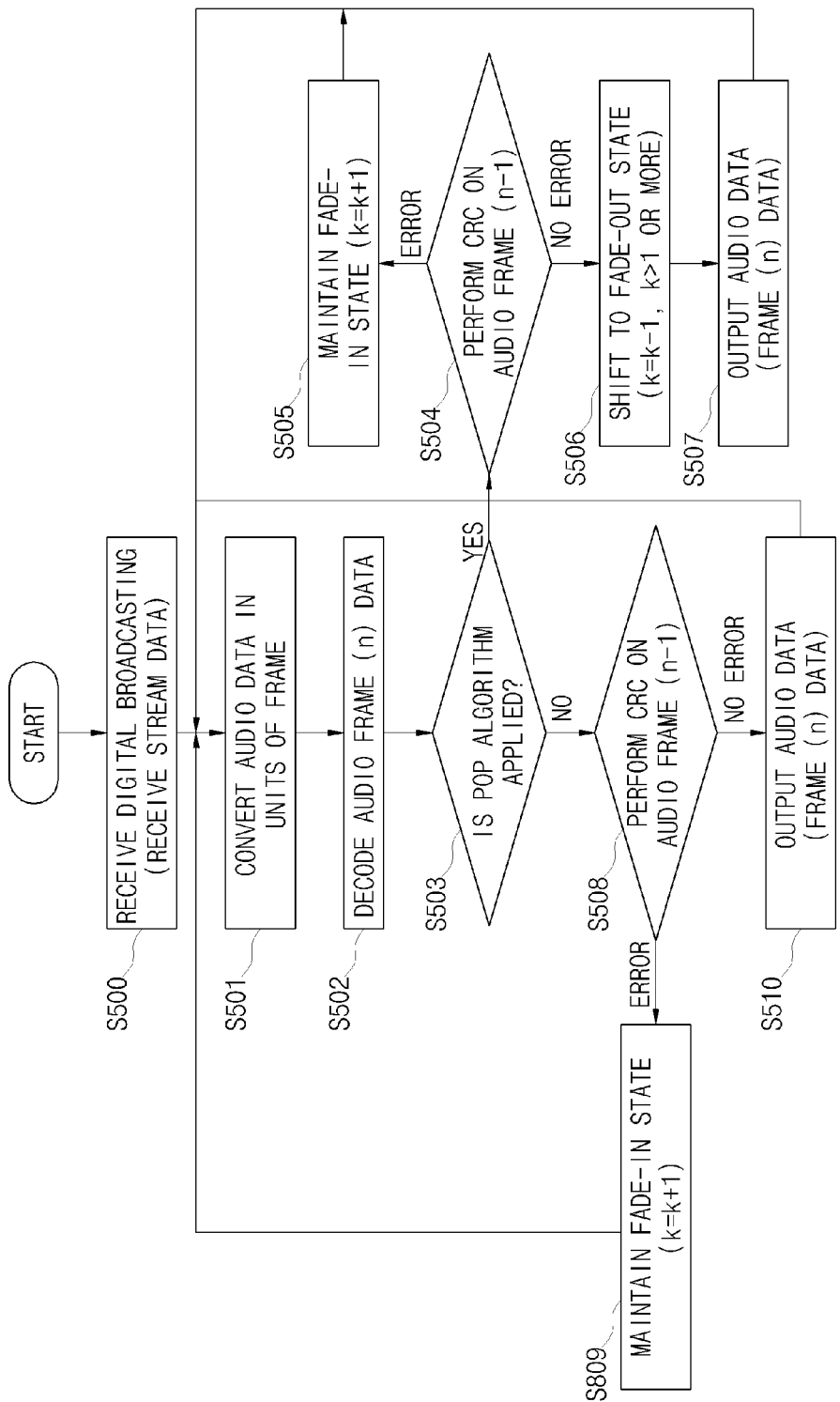

Hereinafter, a pop-noise removing method will be described with reference to FIGS. 1 to 3. FIG. 1 is a diagram for describing detection of a time when occurrence of a pop-noise is predicted and decision of a time when audio is output. FIGS. 2 and 3 are diagrams for describing FIG. 1 in more detail.

The pop-noise removing method of the present invention measures a sensitivity of a received radio signal in receiving a radio signal (audio signal), and prevents an output of the radio signal when the measured sensitivity is equal to or less than a predetermined sensitivity.

That is, the present invention checks an integrity of a received radio signal using an error detection algorithm and then outputs the radio signal, and filters a decoded audio signal to minimize a noise.

When an audio apparatus is frequently in a weak electric field environment, the audio apparatus repeats an operation of outputting a radio audio signal and an operation of stopping an output. Like this, when an operation state of the audio apparatus is suddenly switched from an output state to an output standby state, a discontinuous signal is generated, and a sound pressure difference occurs due to a sudden output of an audio signal, causing occurrence of a popup noise.

The present invention reduces a popup noise in outputting an audio signal (minimizes the popup noise), and provides the audio signal with the minimized popup noise to a user. An anti-discontinuous signal function using fade-in/output decreases a rapid change between an audio signal previous to a disconnection and a disconnected audio signal in a section where the audio signal is disconnected, thus improving a spectrum characteristic or decreasing or a popup noise due to a rapid signal change.

When an audio signal is received, as illustrated in FIG. 1, the present invention performs a cyclic redundancy check (CRC) on data (which is output from an audio stream data buffer) in units of a frame, and determines whether audio frame (n−1) data is broken on the basis of the checked result.

When it is determined that the audio frame (n−1) data is broken, the present invention detects the audio frame (n−1) data being broken before decoding, and thus prevents a pop-noise which occurs when decoding the broken audio frame (n−1) data.

That is, the present invention applies fade-in technology at a time when audio frame (n) data previous to the audio frame (n−1) data is output, thereby minimizing the pop-noise.

Moreover, when audio frame data is successively broken, the present invention mutes audio.

Hereinafter, a method of the present invention that detects a time when occurrence of a pop-noise is predicted and decides a time when audio is output will be described in detail with reference to FIGS. 2 and 3.

Referring to FIG. 2, when a radio frequency (RF) signal is received through an antenna, the method converts the received RF signal into binary data in operation S400, and buffers the converted binary data in operation S401.

The method converts a buffered data stream in units of a frame in operation S402, and sequentially decodes frame-unit data in operation S403.

The method sequentially performs the CRC on frame data to determine whether there is broken data among a plurality of frame data subsequent to currently-decoded fame data in operation S404, and when there is no broken data among the plurality of frame data subsequent to the currently-decoded fame data, an audio output unit outputs the data in operation S405. When there is the broken data among the plurality of frame data subsequent to the currently-decoded fame data, the method predicts occurrence of a popup noise when decoding the frame data subsequent to the currently-decoded fame data.

To provide a more detailed description on the method that detects a time when occurrence of a pop-noise is predicted and decides a time when audio is output, as illustrated in FIG. 3, the method receives digital broadcasting, namely, a data stream in operation S500, and converts the received data stream into frame-unit audio data in operation S501.

The method sequentially decodes the converted frame-unit audio data, namely, decodes the audio frame (n) data in operation S502, and determines whether to apply the error (pop-noise) detection algorithm in operation S503.

When it is determined that the error detection algorithm has been applied, the method performs the CRC on the audio frame (n−1) data to determine whether an error occurs on the basis of the checked result in operation S504.

When it is determined that an error occurs in the audio frame (n−1) data, the method continuously maintains a fade-in state (k=k+1) in operation S504. When it is determined that an error does not occur in the audio frame (n−1) data, the method shifts a current state to a fade-out state (k=k−1, k>1 or more) in operation S505, the method outputs the audio frame (n) data in operation S506.

However, when it is determined in operation S503 that the error detection algorithm is not applied, the method performs the CRC on the audio frame (n−1) data to determine whether an error occurs on the basis of the checked result in operation S508.

When it is determined that an error occurs in the audio frame (n−1) data, the method continuously maintains the fade-in state (k=k+1) in operation S509. When it is determined that an error does not occur in the audio frame (n−1) data, the method outputs the audio frame (n) data in operation S510.

According to the present invention, an output of the pop-noise of digital broadcasting can be minimized.

A number of exemplary embodiments have been described above. Nevertheless, it will be understood that various modifications may be made. For example, suitable results may be achieved if the described techniques are performed in a different order and/or if components in a described system, architecture, device, or circuit are combined in a different manner and/or replaced or supplemented by other components or their equivalents. Accordingly, other implementations are within the scope of the following claims.

What is claimed is:

1. A pop-noise removing method, comprising:
performing, when an audio signal is received, a cyclic redundancy check (CRC) on audio stream data in units of a frame; and
doing, when audio frame data is determined to be broken as the CRC result, a fade-in of an audio volume at an output time of audio frame data just previous to the broken audio frame data, for preventing a pop-noise from occurring when decoding the broken audio frame data.

2. The pop-noise removing method of claim 1, further comprising muting, when audio frame data is determined to be successively broken as the CRC result, the audio volume at the output time of the audio frame data just previous to the broken audio frame data.

3. The pop-noise removing method of claim 1, wherein the performing of a CRC comprises:
converting the audio signal, received through an antenna, into binary data to buffer the converted binary data;
converting the buffered audio data stream in units of a frame; and
sequentially decoding the converted frame-unit data.

4. The pop-noise removing method of claim 3, wherein the performing of a CRC further comprises sequentially performing the CRC on the converted frame-unit data to determine whether there is broken data among a plurality of frame data subsequent to currently-decoded fame data.

5. The pop-noise removing method of claim 3, wherein the doing of a fade-in of an audio volume comprises outputting currently-decoded fame data when there is no broken data among a plurality of frame data subsequent to the currently-decoded fame data.

6. The pop-noise removing method of claim 5, wherein the doing of a fade-in of an audio volume further comprises predicting, when there is the broken data among the plurality of frame data subsequent to the currently-decoded fame data, occurrence of a popup noise in decoding the frame data subsequent to the currently-decoded fame data to do the fade-in of the audio volume at an output time of the currently-decoded fame data.

* * * * *